US012124743B2

(12) United States Patent
Liu et al.

(10) Patent No.: US 12,124,743 B2
(45) Date of Patent: Oct. 22, 2024

(54) DATA READING METHOD, MEMORY STORAGE DEVICE, AND MEMORY CONTROL CIRCUIT UNIT

(71) Applicant: PHISON ELECTRONICS CORP., Miaoli (TW)

(72) Inventors: Yu-Heng Liu, Hsinchu County (TW); Yu-Siang Yang, New Taipei (TW); An-Cheng Liu, Taipei (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 211 days.

(21) Appl. No.: 18/077,190

(22) Filed: Dec. 7, 2022

(65) Prior Publication Data

US 2024/0152296 A1 May 9, 2024

(30) Foreign Application Priority Data

Nov. 7, 2022 (TW) ................................ 111142461

(51) Int. Cl.
*G11C 16/34* (2006.01)
*G06F 3/06* (2006.01)

(52) U.S. Cl.
CPC ........ *G06F 3/0679* (2013.01); *G11C 16/3422* (2013.01)

(58) Field of Classification Search
CPC .... G06F 3/0679; G06F 3/0614; G06F 3/0659; G11C 16/3422; G11C 11/5642; G11C 16/0483; G11C 16/26
USPC ....................................... 365/185.02, 185.24
See application file for complete search history.

(56) References Cited

U.S. PATENT DOCUMENTS

2005/0286299 A1* 12/2005 Tomita ............... G11C 16/3454 365/185.11
2014/0089576 A1* 3/2014 Bains ............... G11C 11/40622 711/E12.001
2018/0159641 A1* 6/2018 Xu .......................... H04W 4/12
2018/0173447 A1* 6/2018 Chin ..................... G06F 3/0619
2019/0267104 A1* 8/2019 Lee ........................ G11C 16/08
(Continued)

FOREIGN PATENT DOCUMENTS

TW 200901203 1/2009
TW 201939512 10/2019

OTHER PUBLICATIONS

"Office Action of Taiwan Counterpart Application", issued on Mar. 3, 2023, p. 1-p. 8.

*Primary Examiner* — Michael T Tran
(74) *Attorney, Agent, or Firm* — JCIPRNET

(57) ABSTRACT

A data reading method, a memory storage device, and a memory control circuit unit are disclosed. The method includes: receiving a read command from a host system, and the read command instructs reading data from at least one logical unit, and the logical unit is mapped to a first physical unit; obtaining state information of at least two neighboring memory cells in the first physical unit; determining an electrical parameter offset value corresponding to the neighboring memory cells according to the state information; and sending a read command sequence according to the electrical parameter offset value, and the read command sequence instructs reading the first physical unit based on at least one electrical parameter, and the electrical parameter is controlled by the electrical parameter offset value.

24 Claims, 12 Drawing Sheets

1002

| | | A state of a memory cell located at BL(n) | | | | | | | |
|---|---|---|---|---|---|---|---|---|---|
| | | Er | A | B | C | D | E | F | G |
| A state of a memory cell located at BL(n-1) | Er | G0 | G0 | G0 | G0 | G0 | G0 | G0 | G0 |
| | A | G1 | G0 | G0 | G0 | G0 | G0 | G0 | G0 |
| | B | G1 | G1 | G0 | G0 | G0 | G0 | G0 | G0 |
| | C | G1 | G1 | G1 | G0 | G0 | G0 | G0 | G0 |
| | D | G1 | G1 | G1 | G1 | G0 | G0 | G0 | G0 |
| | E | G1 | G1 | G1 | G1 | G1 | G0 | G0 | G0 |
| | F | G1 | G1 | G1 | G1 | G1 | G1 | G0 | G0 |
| | G | G1 | G1 | G1 | G1 | G1 | G1 | G1 | G1 |

(56) References Cited

U.S. PATENT DOCUMENTS

| | | | | |
|---|---|---|---|---|
| 2020/0073804 | A1* | 3/2020 | Moon | G11C 16/08 |
| 2021/0118510 | A1* | 4/2021 | Doller | G11C 16/12 |
| 2021/0241838 | A1* | 8/2021 | Cho | G11C 11/5671 |
| 2021/0366539 | A1* | 11/2021 | Kim | H01L 24/08 |
| 2021/0407598 | A1* | 12/2021 | Goode | G11C 16/28 |
| 2022/0180957 | A1* | 6/2022 | Yang | G11C 7/106 |
| 2022/0189545 | A1* | 6/2022 | Muchherla | G11C 16/0483 |

* cited by examiner

1001

| | | A state of a memory cell located at BL(n) | | | | | | | |
|---|---|---|---|---|---|---|---|---|---|
| | | **Er** | **A** | **B** | **C** | **D** | **E** | **F** | **G** |
| **A state of a memory cell located at BL(n+1)** | **Er** | G0 | G0 | G0 | G0 | G0 | G0 | G0 | G0 |
| | **A** | G1 | G0 | G0 | G0 | G0 | G0 | G0 | G0 |
| | **B** | G1 | G1 | G0 | G0 | G0 | G0 | G0 | G0 |
| | **C** | G1 | G1 | G1 | G0 | G0 | G0 | G0 | G0 |
| | **D** | G1 | G1 | G1 | G1 | G0 | G0 | G0 | G0 |
| | **E** | G1 | G1 | G1 | G1 | G1 | G0 | G0 | G0 |
| | **F** | G1 | G1 | G1 | G1 | G1 | G1 | G0 | G0 |
| | **G** | G1 | G1 | G1 | G1 | G1 | G1 | G1 | G1 |

| | | A state of a memory cell located at BL(n) | | | | | | | |
|---|---|---|---|---|---|---|---|---|---|
| | | Er | A | B | C | D | E | F | G |
| A state of a memory cell located at BL(n-1) | Er | G0 | G0 | G0 | G0 | G0 | G0 | G0 | G0 |
| | A | G1 | G0 | G0 | G0 | G0 | G0 | G0 | G0 |
| | B | G1 | G1 | G0 | G0 | G0 | G0 | G0 | G0 |
| | C | G1 | G1 | G1 | G0 | G0 | G0 | G0 | G0 |
| | D | G1 | G1 | G1 | G1 | G0 | G0 | G0 | G0 |
| | E | G1 | G1 | G1 | G1 | G1 | G0 | G0 | G0 |
| | F | G1 | G1 | G1 | G1 | G1 | G1 | G0 | G0 |
| | G | G1 | G1 | G1 | G1 | G1 | G1 | G1 | G1 |

| | | Read a level offset value | | | | | | |
|---|---|---|---|---|---|---|---|---|
| | | L0 | L1 | L2 | L3 | L4 | L5 | L6 |
| Grouping information | BL(n+1)=G0, BL(n-1)=G0 | -3 | -5 | -4 | -4 | -3 | -2 | 0 |
| | BL(n+1)=G1, BL(n-1)=G0 | -2 | -1 | -1 | 0 | 2 | 3 | 1 |
| | BL(n+1)=G0, BL(n-1)=G1 | -2 | -1 | -1 | 0 | 2 | 3 | 1 |
| | BL(n+1)=G1, BL(n-1)=G1 | 1 | 2 | 3 | 4 | 6 | 8 | 1 |

FIG. 10C

DATA READING METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 111142461, filed on Nov. 7, 2022. The entirety of the above-mentioned patent application is hereby incorporated by reference herein and made a part of this specification.

BACKGROUND OF THE INVENTION

Field of the Invention

The invention relates to a memory management technique, and more particularly, to a data reading method, a memory storage device, and a memory control circuit unit.

Description of Related Art

Portable electronic devices such as mobile phones and notebook computers have grown rapidly in the past few years, which has led to a rapid increase in consumer demand for storage media. Since a rewritable non-volatile memory module (such as a flash memory) has characteristics such as data non-volatility, power-saving, small size, and lack of mechanical structures, the rewritable non-volatile memory module is very suitable to be built into the various portable electronic devices provided above.

However, while pursuing to reduce the volume of the rewritable non-volatile memory module, the distance between the memory cells in the rewritable non-volatile memory module is also closer. In turn, the electrical interference between memory cells becomes more significant. Therefore, how to reduce the electrical interference between the memory cells and improve the stability of reading data from the memory cells is one of the topics that those skilled in the art are devoted to research.

SUMMARY OF THE INVENTION

The invention provides a data reading method, a memory storage device, and a memory control circuit unit that may reduce electrical interference between memory cells and improve the stability of reading data from memory cells.

An exemplary embodiment of the invention provides a data reading method configured for a rewritable non-volatile memory module, wherein the rewritable non-volatile memory module includes a plurality of physical units, and the data reading method includes: receiving a read command from a host system, wherein the read command instructs reading data from at least one logical unit, and the logical unit is mapped to a first physical unit in the plurality of physical units; obtaining state information of at least two neighboring memory cells in the first physical unit; determining an electrical parameter offset value corresponding to the neighboring memory cells according to the state information; and sending a read command sequence according to the electrical parameter offset value, wherein the read command sequence instructs reading the first physical unit based on at least one electrical parameter, and the electrical parameter is controlled by the electrical parameter offset value.

An exemplary embodiment of the invention further provides a memory storage device including a connection interface unit, a rewritable non-volatile memory module, and a memory control circuit unit. The connection interface unit is configured to be coupled to a host system. The rewritable non-volatile memory module includes a plurality of physical units. The memory control circuit unit is coupled to the connection interface unit and the rewritable non-volatile memory module. The memory control circuit unit is configured to: receive a read command from a host system, wherein the read command instructs reading data from at least one logical unit, and the logical unit is mapped to a first physical unit in the plurality of physical units; obtain state information of at least two neighboring memory cells in the first physical unit; determine an electrical parameter offset value corresponding to the neighboring memory cells according to the state information; and send a read command sequence according to the electrical parameter offset value, wherein the read command sequence instructs reading the first physical unit based on at least one electrical parameter, and the electrical parameter is controlled by the electrical parameter offset value.

An exemplary embodiment of the invention further provides a memory control circuit unit including a host interface, a memory interface, and a memory management circuit. The host interface is configured to be coupled to a host system. The memory interface is configured to be coupled to a rewritable non-volatile memory module, wherein the rewritable non-volatile memory module includes a plurality of physical units. The memory management circuit is coupled to the host interface and the memory interface. The memory management circuit is configured to: receive a read command from the host system, wherein the read command instructs reading data from at least one logical unit, and the logical unit is mapped to a first physical unit in the plurality of physical units; obtain state information of at least two neighboring memory cells in the first physical unit; determine an electrical parameter offset value corresponding to the neighboring memory cells according to the state information; and send a read command sequence according to the electrical parameter offset value, wherein the read command sequence instructs reading the first physical unit based on at least one electrical parameter, and the electrical parameter is controlled by the electrical parameter offset value.

Based on the above, after the read command is received from the host system, the state information of at least two neighboring memory cells in the first physical unit to be read may be obtained, and the electrical parameter offset value corresponding to the at least two neighboring memory cells may be determined according to the state information. Thereafter, the read command sequence may be sent according to the electrical parameter offset value to instruct to read the first physical unit based on the at least one electrical parameter. In particular, the at least one electrical parameter may be controlled by the electrical parameter offset value. Thereby, the electrical interference between the memory cells may be reduced and the stability of reading data from the memory cells may be improved.

BRIEF DESCRIPTION OF THE DRAWINGS

FIG. 10A and FIG. 10B are schematic diagrams of grouping information of neighboring memory cells corresponding to different state combinations shown according to an exemplary embodiment of the invention.

FIG. 10C is a schematic diagram of read level offset values corresponding to different grouping information shown according to an exemplary embodiment of the invention.

DESCRIPTION OF THE EMBODIMENTS

In general, a memory storage device (also referred to as a memory storage system) includes a rewritable non-volatile memory module and a controller (also referred to as a control circuit). The memory storage device may be used with a host system, such that the host system may write data into the memory storage device or read data from the memory storage device.

Figure 1:
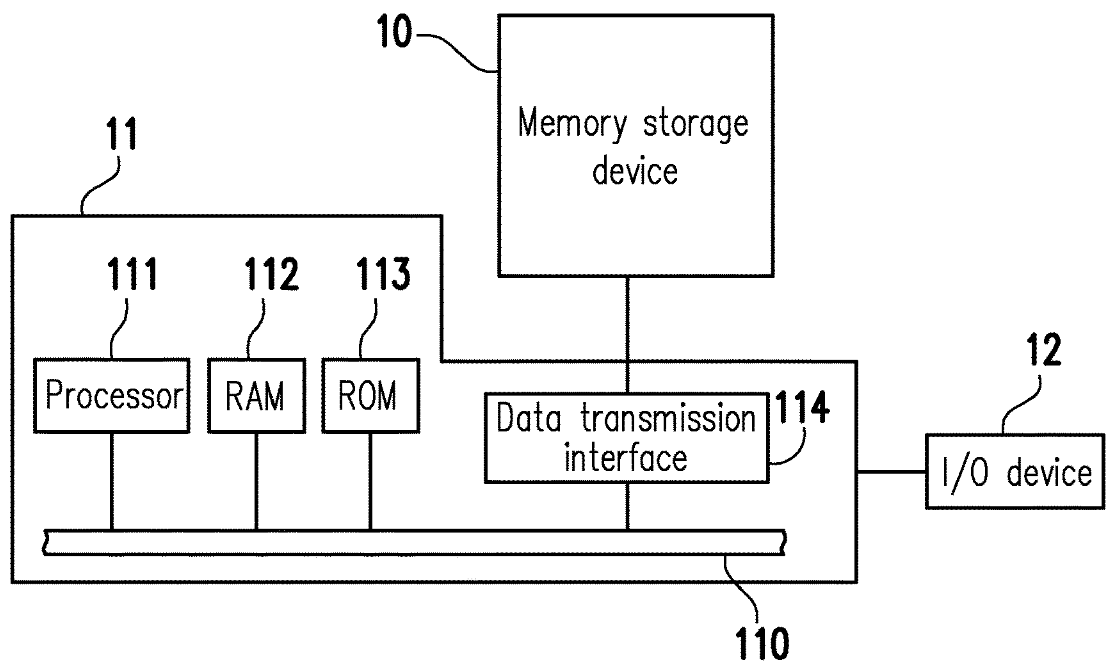
FIG. 1 is a schematic diagram of a host system, a memory storage device, and an input/output (I/O) device shown according to an exemplary embodiment of the invention.
Figure 2:
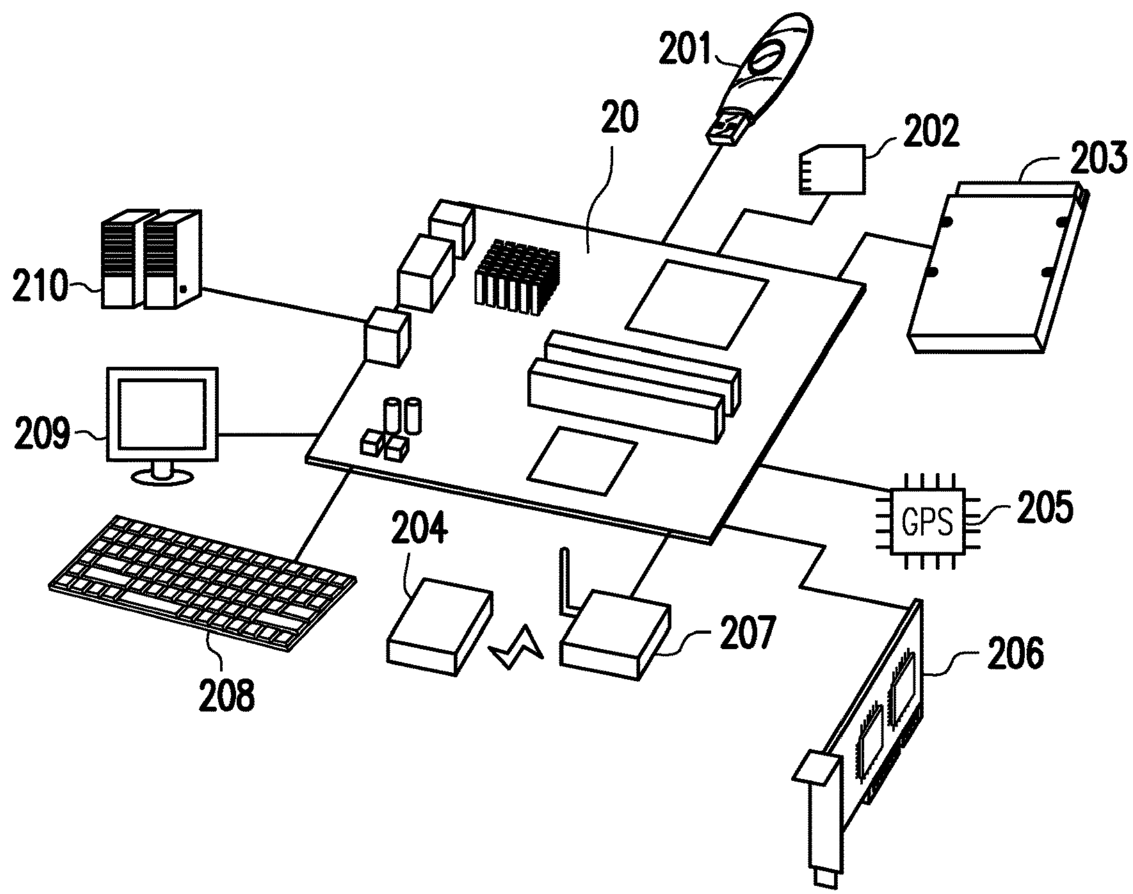
FIG. 2 is a schematic diagram of a host system, a memory storage device, and an I/O device shown according to an exemplary embodiment of the invention.

FIG. 1 is a schematic diagram of a host system, a memory storage device, and an input/output (I/O) device shown according to an exemplary embodiment of the invention. FIG. 2 is a schematic diagram of a host system, a memory storage device, and an I/O device shown according to an exemplary embodiment of the invention.

Referring to FIG. 1 and FIG. 2, a host system 11 may include a processor 111, a random-access memory (RAM) 112, a read-only memory (ROM) 113, and a data transmission interface 114. The processor 111, the RAM 112, the ROM 113, and the data transmission interface 114 may be coupled to a system bus 110.

In an exemplary embodiment, the host system 11 may be coupled to the memory storage device 10 via the data transmission interface 114. For example, the host system 11 may store data into the memory storage device 10 or read data from the memory storage device 10 via the data transmission interface 114. Moreover, the host system 11 may be coupled to the I/O device 12 via the system bus 110. For example, the host system 11 may send an output signal to the I/O device 12 or receive an input signal from the I/O device 12 via the system bus 110.

In an exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method via the data transmission interface 114.

In an exemplary embodiment, the memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

In an exemplary embodiment, the host system 11 is a computer system. In an exemplary embodiment, the host system 11 may be any system that may substantially store data with the memory storage device. In an exemplary embodiment, the memory storage device 10 and the host system 11 may respectively include a memory storage device 30 and a host system 31 of FIG. 3.

Figure 3:
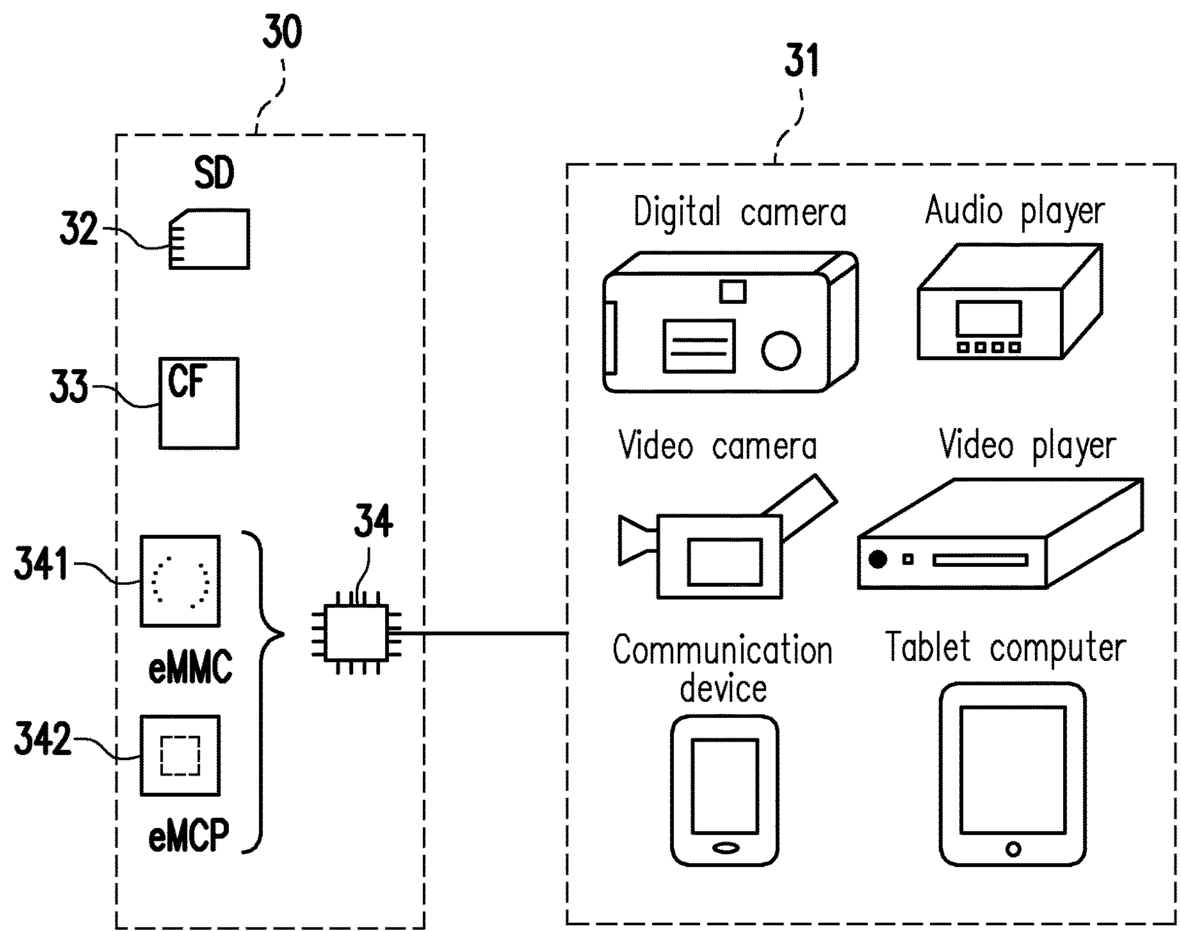
FIG. 3 is a schematic diagram of a host system and a memory storage device shown according to an exemplary embodiment of the invention.

FIG. 3 is a schematic diagram of a host system and a memory storage device shown according to an exemplary embodiment of the invention.

Referring to FIG. 3, the memory storage device 30 may be used in conjunction with the host system 31 to store data. For example, the host system 31 may be a system such as a digital camera, a camcorder, a communication device, an audio player, a video player, or a tablet computer. For example, the memory storage device 30 may be various non-volatile memory storage devices such as a Secure Digital (SD) card 32, a Compact Flash (CF) card 33, or an embedded storage device 34 used by the host system 31. The embedded storage device 34 includes various types of embedded storage devices for which a memory module is directly coupled on the substrate of the host system, such as an embedded multimedia card (eMMC) 341 and/or an embedded multi-chip package (eMCP) storage device 342.

Figure 4:
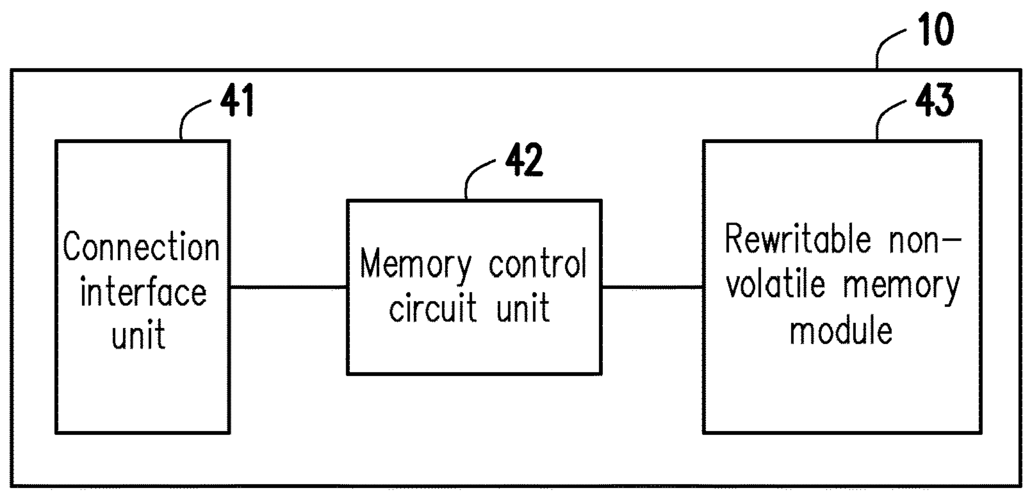
FIG. 4 is a schematic diagram of a memory storage device shown according to an exemplary embodiment of the invention.

FIG. 4 is a schematic diagram of a memory storage device shown according to an exemplary embodiment of the invention.

Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may be communicated with the host system 11 via the connection interface unit 41. In an exemplary embodiment, the connection interface unit 41 is compatible with the Peripheral Component Interconnect Express (PCI Express) standard. In an exemplary embodiment, the connection interface unit 41 may also conform to the Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 41 may be sealed in a chip with the memory control circuit unit 42. Alternatively, the connection interface unit 41 is disposed outside of a chip containing the memory control circuit unit 42.

The memory control circuit unit 42 is coupled to the connection interface unit 41 and the rewritable non-volatile memory module 43. The memory control circuit unit 42 is configured to perform a plurality of logic gates or control commands implemented in a hardware form or in a firmware form. The memory control circuit unit 404 also performs operations such as writing, reading, and erasing data in the rewritable non-volatile memory storage module 43 according to the commands of the host system 11.

The rewritable non-volatile memory module 43 is configured to store the data written by the host system 11. The rewritable non-volatile memory module 43 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 43 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 43 has a plurality of storage states. Which storage state one memory cell belongs to may be determined via the application of a read voltage, so as to obtain one or a plurality of bits stored by the memory cell.

In an exemplary embodiment, the memory cells of the rewritable non-volatile memory module 43 may form a plurality of physical programming units, and these physical programming units may form a plurality of physical erasing units. Specifically, the memory cells on the same word line may form one or a plurality of physical programming units. If one memory cell may store two or more bits, the physical programming units on the same word line may at least be classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming unit may include a data bit region and a redundancy bit region. The data bit region contains a plurality of physical pages configured to store user data, and the redundancy bit region is configured to store system data (for example, management data such as an error correcting code). In an exemplary embodiment, the data bit region contains 32 physical pages, and the size of one physical sector is 512 bytes (B). However, in other exemplary embodiments, the data bit region may also contain 8, 16, or a greater or lesser number of physical pages, and the size of each of the physical pages may also be greater or smaller. Moreover, the physical erasing unit is the smallest unit of erasing. That is, each of the physical erasing units contains the smallest number of memory cells erased together. For example, the physical erasing unit is a physical block.

In an exemplary embodiment, the memory cells in the rewritable non-volatile memory module 43 are disposed in a three-dimensional array. However, in another exemplary embodiment, the memory cells in the rewritable non-volatile memory module 43 are disposed in a two-dimensional array.

Figure 5A:
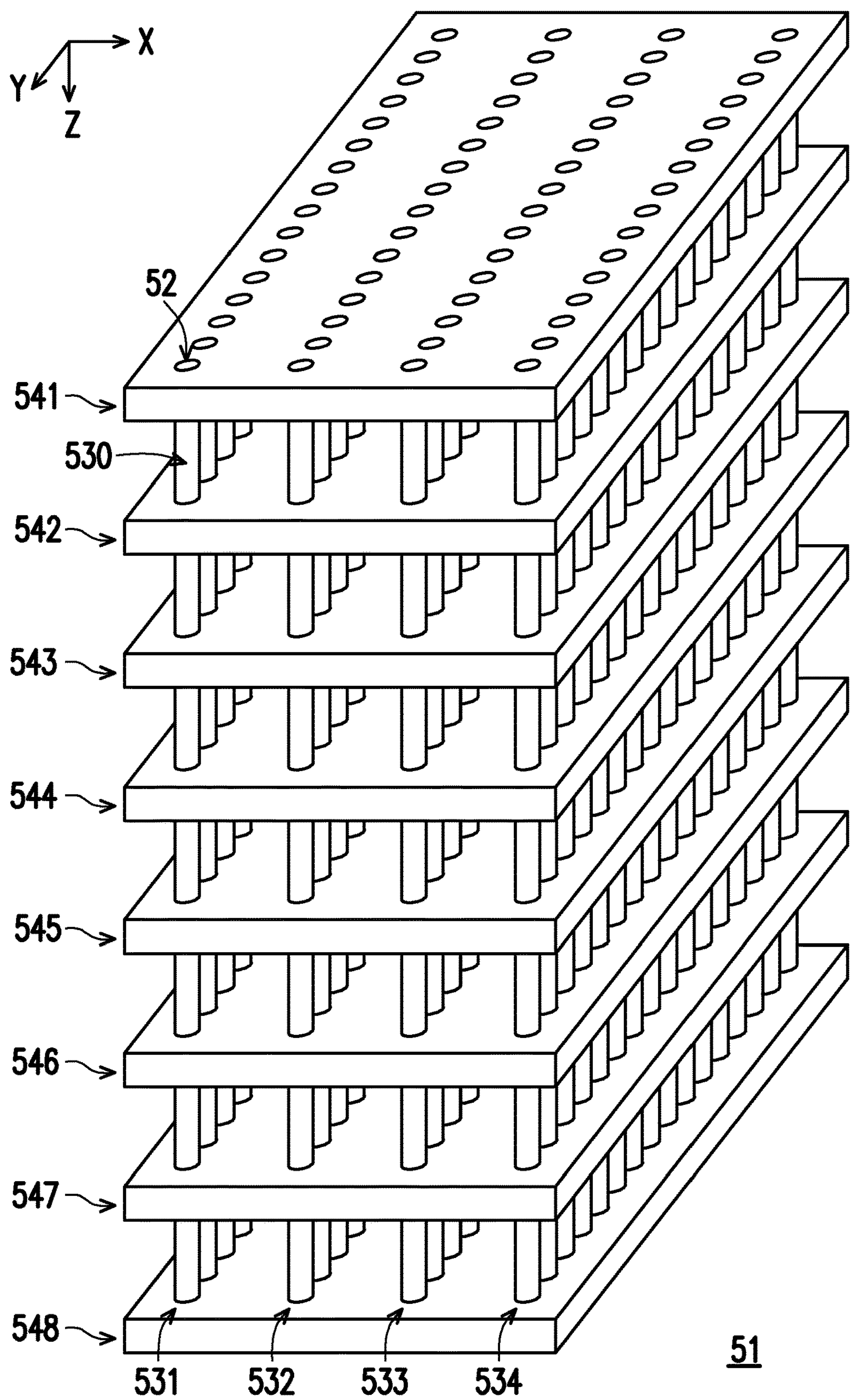
FIG. 5A is a schematic diagram of a three-dimensional memory cell array shown according to an exemplary embodiment of the invention.

FIG. 5A is a schematic diagram of a three-dimensional memory cell array shown according to an exemplary embodiment of the invention.

Referring to FIG. 5A, a memory cell array 51 includes a plurality of memory cells 52 configured to store data, a plurality of bit line groups 531 to 534, and a plurality of word line layers 541 to 548. The bit line groups 531 to 534 are independent of each other (e.g., separated from each other) and arranged along a first direction (e.g., the X-axis direction). Each of the bit line groups 531 to 534 includes a plurality of bit lines 530 independent of each other (e.g., separated from each other). The bit lines 530 in each of the bit line groups are arranged along a second direction (e.g., the Y-axis direction) and extended toward a third direction (e.g., the Z-axis direction). The word line layers 541 to 548 are independent of each other (e.g., separated from each other) and stacked along the third direction.

In an exemplary embodiment, each of the word line layers in the word line layers 541 to 548 may also be regarded as one word line plane. Each of the memory cells 52 is disposed at each intersection between each of the bit lines 530 in the bit line groups 531 to 534 and the word line layers 541 to 548.

It should be noted that, the memory cell array 51 of FIG. 5A is only one example, and in other exemplary embodiments not mentioned, the total number of the memory cells 52, the total number of the bit line groups 531 to 534, and the total number of the word line layers 541 to 548 may all be different. Moreover, in another exemplary embodiment, one bit line group may include more or fewer bit lines, and one word line layer may also allow more or fewer bit line groups to pass. Alternatively, in an exemplary embodiment, the memory cells in the rewritable non-volatile memory module 43 may also be disposed in other ways, which are not limited in the invention.

Figure 5B:
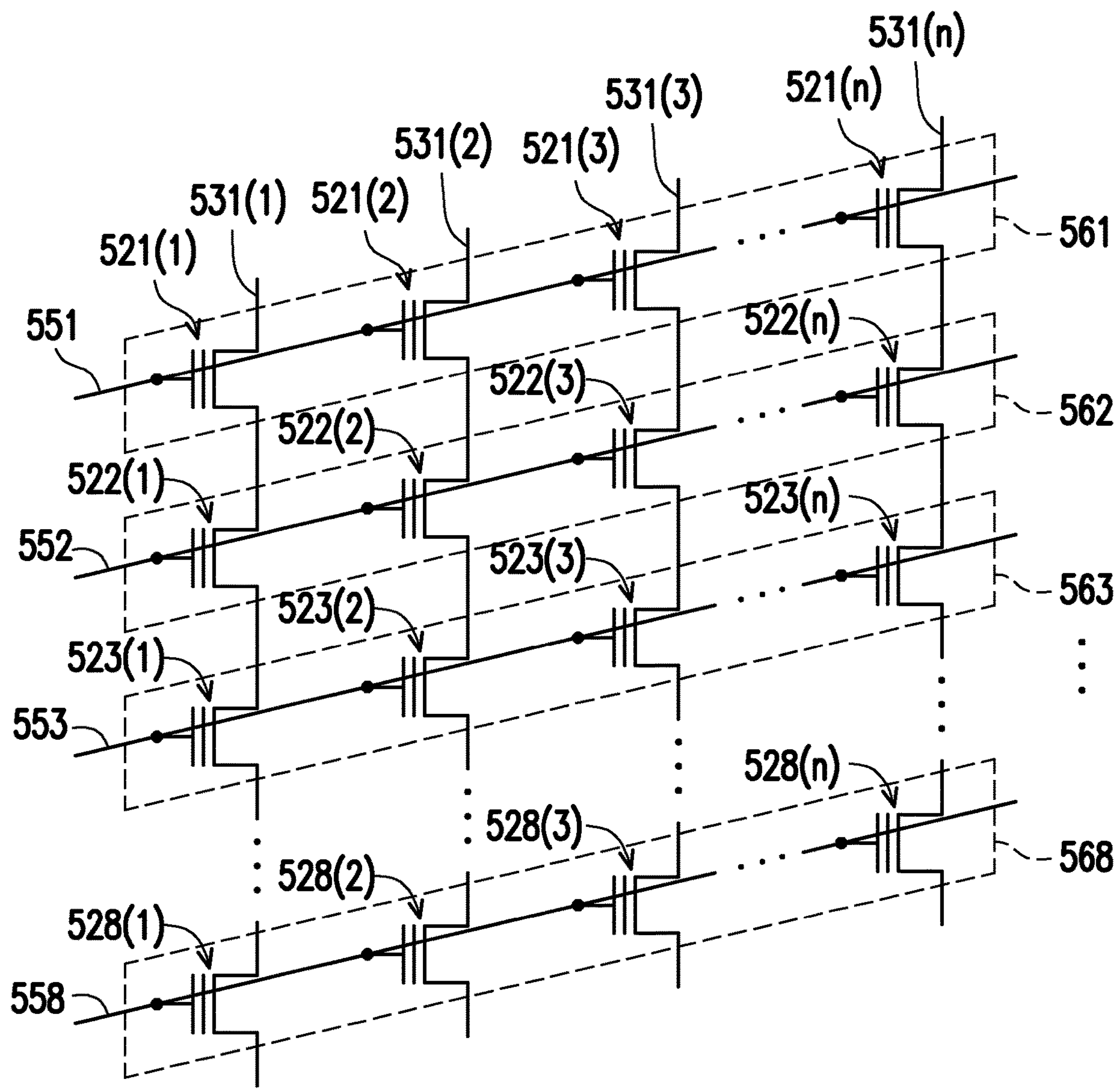
FIG. 5B is a schematic diagram of an equivalent circuit of a three-dimensional memory cell array shown according to an exemplary embodiment of the invention.

FIG. 5B is a schematic diagram of an equivalent circuit of a three-dimensional memory cell array shown according to an exemplary embodiment of the invention.

Referring to FIG. 5A and FIG. 5B, transistor units 521(1) to 521(*n*) may be located in the word line layer 541. Transistor units 522(1) to 522(*n*) may be located in the word line layer 542. Transistor units 523(1) to 523(*n*) may be located in the word line layer 543. Transistor units 528(1) to 528(*n*) may be located in the word line layer 548. One transistor unit may be equivalent to one memory cell. The bit line group 531 may include bit lines 531(1) to 531(*n*). A bit line 531(1) is connected in series to the transistor unit 521(1), the transistor unit 522(1), the transistor unit 523(1) . . . and the transistor unit 528(1). A bit line 531(2) is connected in series to the transistor unit 521(2), the transistor unit 522(2), the transistor unit 523(2) . . . and the transistor unit 528(2). A bit line 531(3) is connected in series to the transistor unit 521(3), the transistor unit 522(3), the transistor unit 523(3) . . . and the transistor unit 528(3). By analogy, a bit line 531(*n*) is connected in series to the transistor unit 521(*n*), the transistor unit 522(*n*), the transistor unit 523(*n*) . . . and the transistor unit 528(*n*).

A word line 551 is located at the word line layer 541. A word line 552 is located at the word line layer 542. A word line 553 is located at the word line layer 543. By analogy, a word line 558 is located at the word line layer 548. The word line 551 is connected in series to the transistor units 521(1) to 521(*n*). The word line 552 is connected in series to the transistor units 522(1) to 522(*n*). The word line 553 is connected in series to the transistor units 523(1) to 523(*n*). The word line 558 is connected in series to the transistor units 528(1) to 528(*n*). It should be noted that FIG. 5B only shows a portion of the members in each of the word line layers in FIG. 5A, and the rest may be deduced by analogy.

In the present exemplary embodiment, the total number of transistor units connected in series to the same word line may be equal to the total number of memory cells included in one physical unit. For example, the transistor units 521(1) to 521(*n*) are included in the physical unit 561, the transistor units 522(1) to 522(*n*) are included in the physical unit 562, the transistor units 523(1) to 523(*n*) are included in the physical unit 563, and the transistor units 528(1) to 528(*n*) are included in the physical unit 568. Taking the physical unit 561 as an example, when the data stored in the physical unit 561 is to be read, the storage states of the transistor units 521(1) to 521(*n*) may be read simultaneously; in addition, when data is to be stored in the physical unit 561, the transistor units 521(1) to 521(*n*) may be programmed simultaneously.

In an exemplary embodiment, the total number of memory cells included in each of the physical units 561 to 568 is equal to the total number of memory cells included in one physical programming unit. That is, in an exemplary embodiment, the physical units 561 to 568 are respectively regarded as one physical programming unit. In an exemplary embodiment, at least one of the physical units 561 to 568 may also include a plurality of physical programming units.

Figure 6:
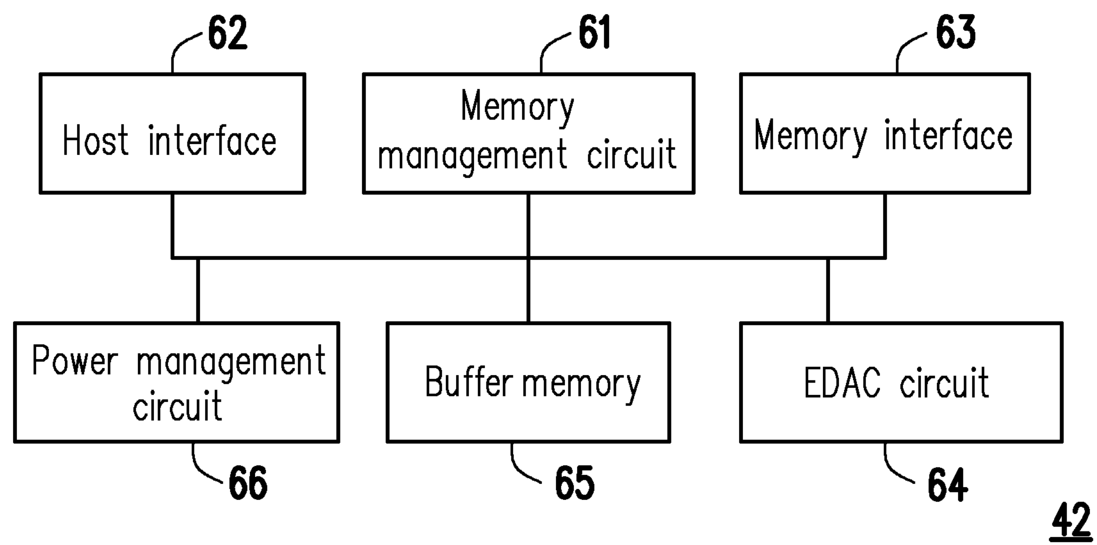
FIG. 6 is a schematic diagram of a memory control circuit unit shown according to an exemplary embodiment of the invention.

FIG. 6 is a schematic diagram of a memory control circuit unit shown according to an exemplary embodiment of the invention.

Referring to FIG. 6, the memory control circuit unit 42 includes a memory management circuit 61, a host interface 62, and a memory interface 63. The memory management circuit 61 is configured to control the overall operation of the memory control circuit unit 42. Specifically, the memory management circuit 61 has a plurality of control commands. During the operation of the memory storage device 10, the control commands are executed to perform operations such as writing, reading, and erasing data. In the following, descriptions relating to the operation of the memory management circuit 61 are equivalent to the descriptions of the operation of the memory control circuit unit 42.

In an exemplary embodiment, the control commands of the memory management circuit 61 are implemented in a firmware form. For example, the memory management circuit 61 has a microprocessor unit (not shown) and a read-only memory (not shown), and the control commands are burned into a ROM. During the operation of the memory storage device 10, the control commands are executed by a microprocessor unit to perform operations such as writing, reading, and erasing data.

In an exemplary embodiment, the control commands of the memory management circuit 61 may also be stored in the form of program codes in a specific area (for example, the system area in a memory module exclusively configured to store system data) of the rewritable non-volatile memory module 43. Moreover, the memory management circuit 61 has a microprocessor unit (not shown), a ROM (not shown), and a RAM (not shown). In particular, the ROM has a boot code, and when the memory control circuit unit 42 is enabled, the microprocessor unit first executes the boot code to load the control commands stored in the rewritable non-volatile memory module 43 into the RAM of the memory management circuit 61. Next, the microprocessor unit runs the control commands to perform operations such as writing, reading, and erasing data.

In an exemplary embodiment, the control commands of the memory management circuit 61 may also be implemented in a hardware form. For example, the memory management circuit 61 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage the memory cells or memory cell groups of the rewritable non-volatile memory module 43. The memory write circuit is configured to issue a write command sequence to the rewritable non-volatile memory module 43 to write data into the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process data to be written into the rewritable non-volatile memory module 43 and data read from the rewritable non-volatile memory module 43. The write command sequence, the read command sequence, and the erase command sequence may independently include one or a plurality of program codes or command codes and be configured to instruct the rewritable non-volatile memory module 43 to perform corresponding operations such as writing, reading, and erasing. In an exemplary embodiment, the memory management circuit 61 may also issue other types of command sequences to the rewritable non-volatile memory module 43 to instruct the performance of corresponding operations.

The host interface 62 is coupled to the memory management circuit 61. The memory management circuit 61 may be communicated with the host system 11 via the host interface 62. The host interface 62 may be used to receive and identify commands and data sent by the host system 11. For example, the commands and data sent by the host system 11 may be sent to the memory management circuit 61 via the host interface 62. In addition, the memory management circuit 61 may send data to the host system 11 via the host interface 62. In the present exemplary embodiment, the host interface 62 is compatible with the PCI Express standard. However, it should be understood that the invention is not limited thereto, and the host interface 62 may also be compatible with the SATA standard, PATA standard, IEEE 1394 standard, USB standard, SD standard, UHS-I standard, UHS-II standard, MS standard, MMC standard, eMMC standard, UFS standard, CF standard, IDE standard, or other suitable standards for data transmission.

The memory interface 63 is coupled to the memory management circuit 61 and configured to access the rewritable non-volatile memory module 43. For example, the memory management circuit 61 may access the rewritable non-volatile memory module 43 via the memory interface 63. In other words, data to be written into the rewritable non-volatile memory module 43 is converted to a format acceptable to the rewritable non-volatile memory module 43 via the memory interface 63. Specifically, if the memory management circuit 61 is to access the rewritable non-volatile memory module 43, the memory interface 63 sends a corresponding command sequence. For example, the command sequences may include a write command sequence instructing data writing, a read command sequence instructing data reading, an erase command sequence instructing data erasing, and corresponding command sequences configured to instruct various memory operations (such as changing read voltage level or performing a garbage collection operation). The command sequences are generated by, for example, the memory management circuit 61 and sent to the rewritable non-volatile memory module 43 via the memory interface 63. The command sequences may include one or a plurality of signals or data on a bus. The signals or data may include a command code or a program code. For example, when reading a command sequence, information such as read identification code or memory address is included.

In an exemplary embodiment, the memory control circuit unit 42 further includes an error detection and correction circuit 64, a buffer memory 65, and a power management circuit 66.

The error detection and correction circuit 64 is coupled to the memory management circuit 61 and configured to execute an error detection and correction operation to ensure the correctness of data. Specifically, when the memory management circuit 61 receives a write command from the host system 11, the error detection and correction circuit 64 generates a corresponding error correcting code (ECC) and/or an error detecting code (EDC) for data corresponding to the write command, and the memory management circuit 61 writes the data corresponding to the write command and the corresponding ECC and/or EDC into the rewritable non-volatile memory module 43. Next, when data is read from the rewritable non-volatile memory module 43, the memory management circuit 61 reads the ECC and/or the EDC corresponding to the data at the same time, and the error detection and correction circuit 64 executes an error detection and correction operation on the read data based on the ECC and/or the EDC.

The buffer memory 65 is coupled to the memory management circuit 61 and configured to temporarily store data. The power management circuit 66 is coupled to the memory management circuit 61 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 61 of FIG. 6 may include a flash memory management circuit.

Figure 7:
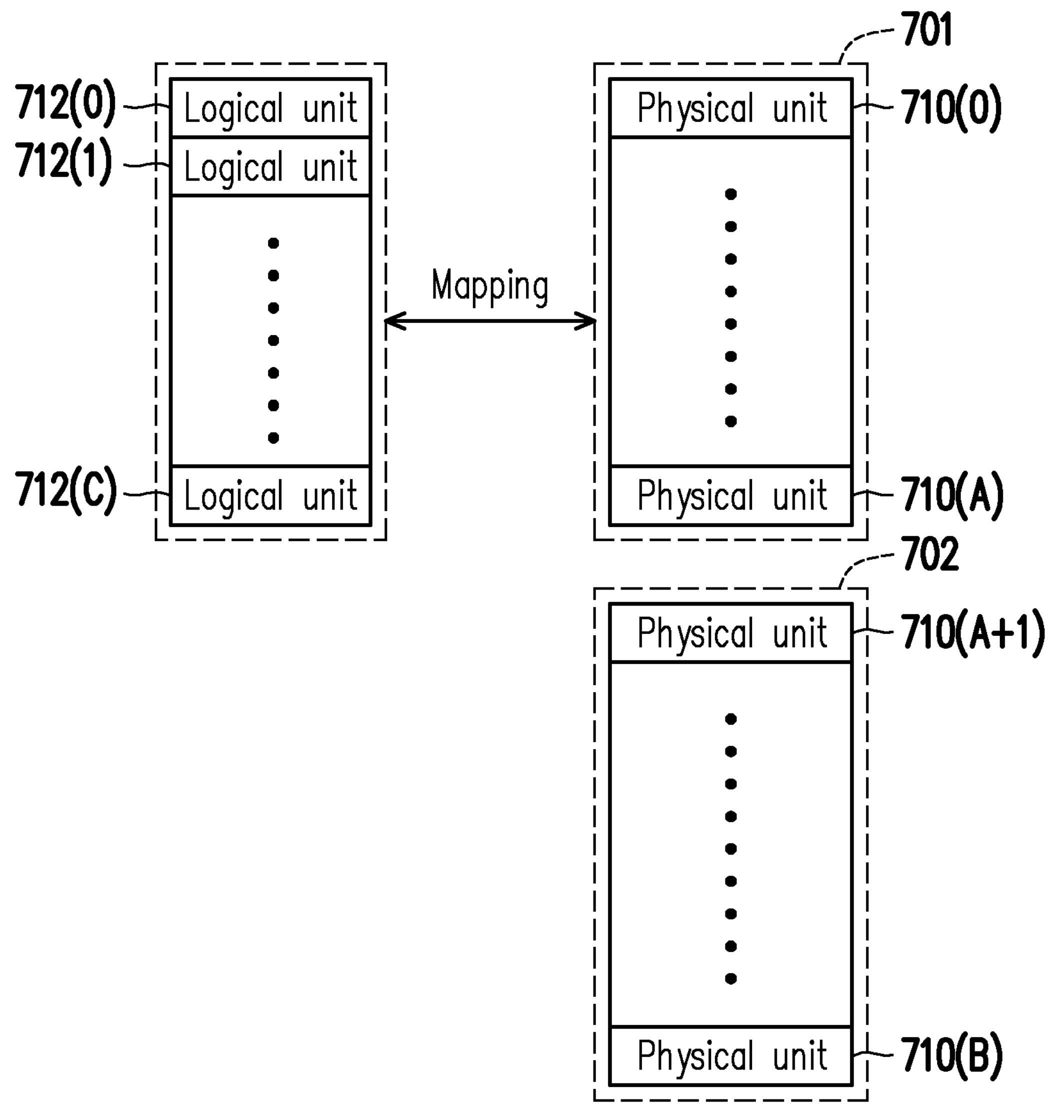
FIG. 7 is a schematic diagram of the management of a rewritable non-volatile memory module shown according to an exemplary embodiment of the invention.

FIG. 7 is a schematic diagram of the management of a rewritable non-volatile memory module shown according to an exemplary embodiment of the invention.

Referring to FIG. 7, the memory management circuit 61 may logically group physical units 710(0) to 710(B) in the rewritable non-volatile memory module 43 into a storage region 701 and a spare region 702.

The physical units 710(0) to 710(A) in the storage region 701 are configured to store user data (for example, user data from the host system 11 in FIG. 1). For example, the physical units 710(0) to 710(A) in the storage region 701 may store valid data and/or invalid data. The physical erasing units 710(A+1) to 710(B) in the spare region 702 do not store data (for example, valid data). For example, if a certain physical unit does not store valid data, this physical unit may be associated (or added) to the spare region 702. In addition, the physical units in the spare region 702 (or physical units that do not store valid data) may be erased. When writing new data, one or a plurality of physical units may be extracted from the spare region 702 to store the new data. In an exemplary embodiment, the spare region 702 is also referred to as a free pool.

The memory management circuit 61 may configure logical units 712(0) to 712(C) to map the physical units 710(0) to 710(A) in the storage region 701. In an exemplary embodiment, each of the logical units corresponds to one logical address. For example, one logical address may include one or a plurality of logical block addresses (LBAs) or other logical management units. In an exemplary embodiment, one logical unit may also correspond to one logical programming unit or formed by a plurality of continuous or discontinuous logical addresses.

It should be mentioned that, one logical unit may be mapped to one or a plurality of physical units. If a certain physical unit is currently mapped by a certain logical unit, the data currently stored in this physical unit includes valid data. On the other hand, if a certain physical unit is not currently mapped by any logical unit, the data currently stored in this physical unit is invalid data.

The memory management circuit 61 may record the management data describing the mapping relationship between logical units and physical units (also called logical-to-physical mapping information) in at least one logical-to-physical mapping table. When the host system 11 of FIG. 1 is to read data from the memory storage device or write data to the memory storage device 10, the memory management circuit 61 may access the rewritable non-volatile memory module 43 according to the information in the logical-to-physical mapping table to store data in the rewritable non-volatile memory module 43 or read data from the rewritable non-volatile memory module 43.

The memory management circuit 61 may receive a read command from the host system 11 of FIG. 1. The read command may instruct to read data from at least one logical unit. The at least one logical unit may be mapped to at least one physical unit (also referred to as a first physical unit) in the rewritable non-volatile memory module 43. For example, the first physical unit may include at least one of the physical units 710(0) to 710(A) in FIG. 7.

The memory management circuit 61 may obtain state information of at least two neighboring memory cells in the first physical unit. The state information may reflect the voltage range corresponding to the respective threshold voltages of the at least two neighboring memory cells.

In an exemplary embodiment, the at least two neighboring memory cells may include a first memory cell and a second memory cell. The first memory cell and the second memory cell may be respectively located on different bit lines adjacent to each other in the rewritable non-volatile memory module 43. In addition, the total number of the second memory cell may be one or a plurality, as long as the second memory cell is adjacent to the first memory cell in physical position (or in physical space).

The memory management circuit 61 may determine one or a plurality of electrical parameter offset values corresponding to the at least two neighboring memory cells according to the state information. For example, the electrical parameter offset value may include a read level offset value, a pass gate voltage offset value, or a combination thereof. Then, the memory management circuit 61 may send one or a plurality of read command sequences according to the electrical parameter offset value. The read command sequence may instruct to read the first physical unit based on at least one electrical parameter to obtain the data instructed by the read command to be read. In particular, the at least one electrical parameter may be controlled (e.g., determined, updated, or adjusted) by the electrical parameter offset value. For example, the electrical parameter may include read voltage level, pass gate voltage, or a combination thereof.

In an exemplary embodiment, the electrical parameter offset value may include a read level offset value. The read level offset value may be configured to control (e.g., determine, update, or adjust) the read voltage level applied to the first memory cell during a period of reading data from the first memory cell. Therefore, according to the read command sequence, during the period of reading data from the first memory cell, the rewritable non-volatile memory module 43 may adjust the read voltage level corresponding to the first memory cell based on the read level offset value and apply the adjusted read voltage level to the first memory cell. Thereby, the accuracy of the data read from the first memory cell may be improved.

In an exemplary embodiment, the electrical parameter offset value may also include a pass gate voltage offset value. The pass gate voltage offset value may be configured to control (e.g., determine, update, or adjust) the pass gate voltage applied to the second memory cell during a period of reading data from the first memory cell. Therefore, according to the read command sequence, during the period of reading data from the first memory cell, the rewritable non-volatile memory module 43 may adjust the pass gate voltage corresponding to the second memory cell based on the pass gate voltage offset value and apply the adjusted pass gate voltage to the second memory cell. Thereby, the accuracy of the data read from the first memory cell may be improved.

Figure 8:
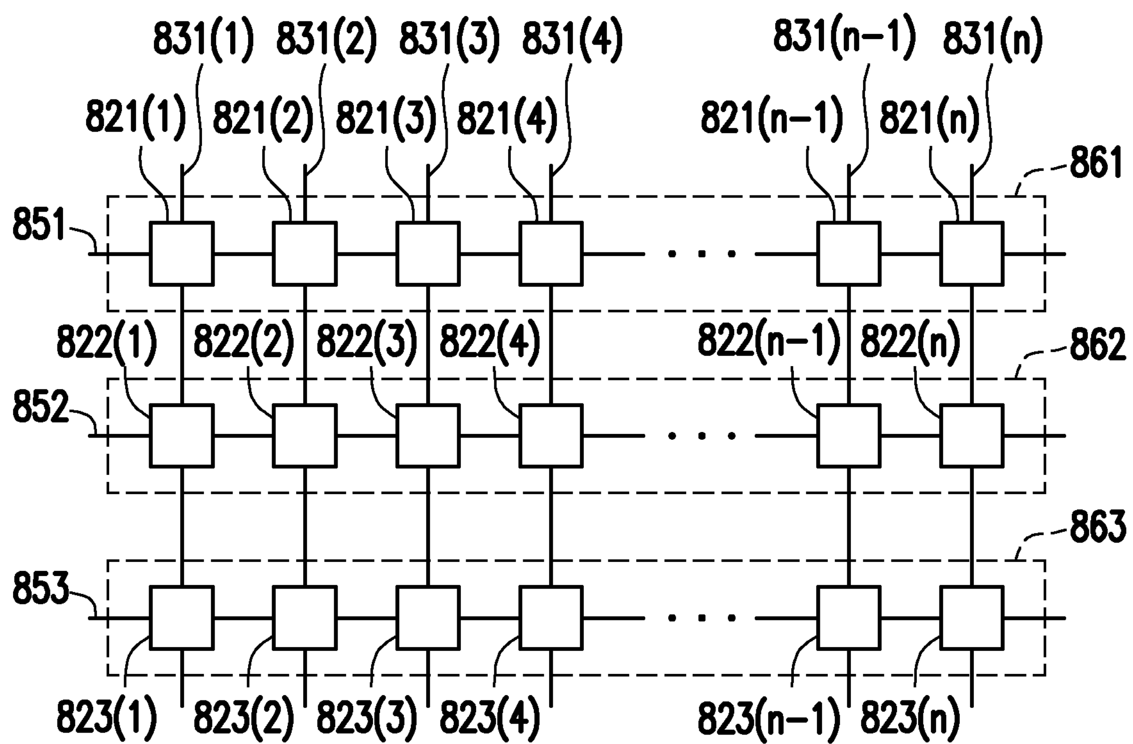
FIG. 8 is a schematic diagram of neighboring memory cells shown according to an exemplary embodiment of the invention.

FIG. 8 is a schematic diagram of neighboring memory cells shown according to an exemplary embodiment of the invention.

Referring to FIG. 8, a physical unit 861 includes memory cells 821(1) to 821(*n*), a physical unit 862 includes memory cells 822(1) to 822(*n*), and a physical unit 863 includes memory cells 823(1) to 823(*n*). In a direction parallel to the word line plane, the memory cells 821(1) to 821(*n*) are connected in series via a word line 851, the memory cells 822(1) to 822(*n*) are connected in series via a word line 852, and the memory cells 823(1) to 823(*n*) are connected in series via a word line 853. Moreover, a bit line 831(1) is connected in series to the memory cells 821(1), 822(1), and 823(1), a bit line 831(2) is connected in series to the memory cells 821(2), 822(2), and 823(2), and a bit line 831(3) is connected in series to the memory cells 821(3), 822(3), and 823(3). By analogy, a bit line 831(*n*) is connected in series to the memory cells 821(*n*), 822(*n*), and 823(*n*). In addition, the bit lines 831(1) to 831(*n*) belong to the same bit line group.

In the exemplary embodiment of FIG. 8, the bit line 831(*i*) is adjacent to bit lines 831(*i*−1) (if present) and 831(*i*+1) (if present). Therefore, the memory cell 821(*i*) is adjacent to the memory cells 821(*i*−1) (if present) and 821(*i*+1) (if present), the memory cell 822(*i*) is adjacent to the memory cells 822(*i*−1) (if present) and 822(*i*+1) (if present), and the memory cell 823(*i*) is adjacent to memory cells 823(*i*−1) (if present) and 823(*i*+1) (if present). From another perspective, assuming that the memory cell 821(*i*) is the first memory cell, the second memory cell may include the memory cells 821(*i*−1) and/or 821(*i*+1). Or, assuming that the memory cell 822(*i*) is the first memory cell, the second memory cell may include the memory cells 822(*i*−1) and/or 822(*i*+1). Or, assuming that the memory cell 823(*i*) is the first memory cell, the second memory cell may include the memory cells 823(*i*−1) and/or 823(*i*+1).

Taking FIG. 8 as an example, it is assumed that the first physical unit is the physical unit 861 and the first memory cell is the memory cell 821(*i*). In response to a read command from the host system 11 of FIG. 1, the state information of the memory cells 821(*i*), 821(*i*−1) (if present), and 821(*i*+1) (if present) neighboring each other may be obtained. According to the state information, the memory management circuit 61 may determine one or a plurality of electrical parameter offset values corresponding to the memory cells 821(*i*), 821(*i*−1) (if present), and 821(*i*+1) (if present).

In an exemplary embodiment, the determined electrical parameter offset value includes a read level offset value corresponding to the memory cell 821(*i*). The memory management circuit 61 may send a read command sequence to the rewritable non-volatile memory module 43 according to the read level offset value. The read command sequence may be configured to instruct the rewritable non-volatile memory module 43 to read data from the physical unit 861. In particular, the read command sequence may instruct the rewritable non-volatile memory module 43 to adjust the read voltage level corresponding to the memory cell 821(*i*) based on the read level offset value and apply the adjusted read voltage level to the memory cell 821(*i*) during the period of reading data from physical unit 861 (or the memory cell 821(*i*)). Thereby, the accuracy of the data read from the memory cell 821(*i*) may be improved.

In an exemplary embodiment, the determined electrical parameter offset value may also include a pass gate voltage offset value corresponding to the memory cells 821(*i*−1) (if present) and/or 821(*i*+1) (if present). The memory management circuit 61 may send a read command sequence to the rewritable non-volatile memory module 43 according to the pass gate voltage offset value. The read command sequence may be configured to instruct the rewritable non-volatile memory module 43 to read data from the physical unit 861. In particular, the read command sequence may instruct the rewritable non-volatile memory module 43 to adjust the pass gate voltage corresponding to the memory cells 821(*i*−1) (if present) and/or 821(*i*+1) (if present) based on the pass gate voltage offset value and apply the adjusted pass gate voltage to the memory cells 821($i$−1) (if present) and/or 821($i$+1) (if present) during the period of reading data from the physical unit 861 (or the memory cell 821($i$)). Thereby, the accuracy of the data read from the memory cell 821($i$) may also be improved.

Figure 9:
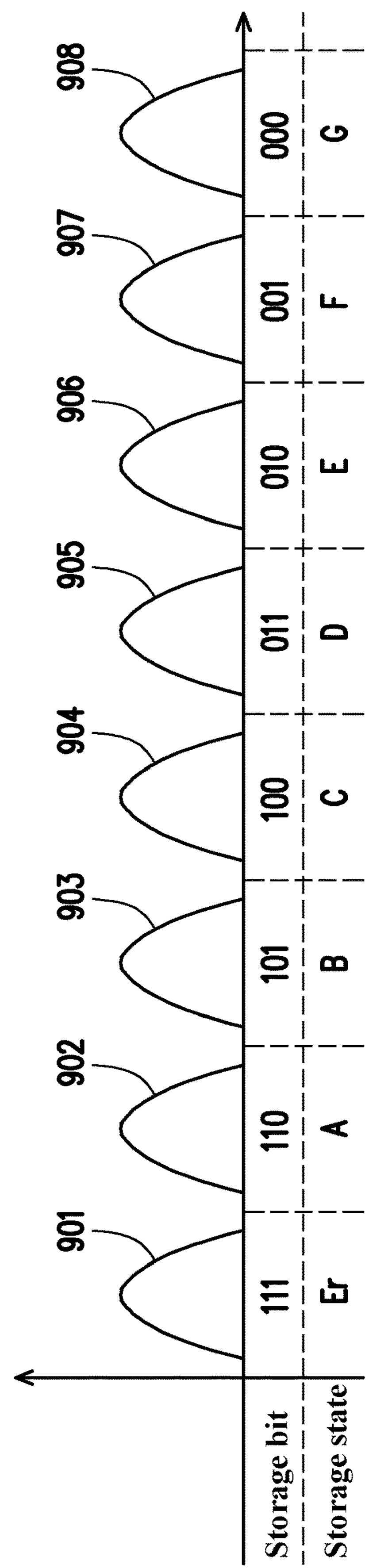
FIG. 9 is a schematic diagram of different storage states of a memory cell shown according to an exemplary embodiment of the invention.

FIG. 9 is a schematic diagram of different storage states of a memory cell shown according to an exemplary embodiment of the invention.

Referring to FIG. 9, taking a TLC NAND flash memory as an example, the storage state of each of the memory cells in the first physical unit may be one of states 901 to 908. The states 901 to 908 correspond to different voltage ranges respectively. For example, if the storage state of a certain memory cell is the state 901, the memory cell may currently be configured to store bits "111", and the storage state of the memory cell may be represented by state information "Er". If the storage state of a certain memory cell is the state 902, the memory cell may currently be configured to store bits "110", and the storage state of the memory cell may be represented by state information "A". If the storage state of a certain memory cell is the state 903, the memory cell may currently be configured to store bits "101", and the storage state of the memory cell may be represented by state information "B". If the storage state of a certain memory cell is the state 904, the memory cell may currently be configured to store bits "100", and the storage state of the memory cell may be represented by state information "C". If the storage state of a certain memory cell is the state 905, the memory cell may currently be configured to store bits "011", and the storage state of the memory cell may be represented by state information "D". If the storage state of a certain memory cell is the state 906, the memory cell may currently be configured to store bits "010", and the storage state of the memory cell may be represented by state information "E". If the storage state of a certain memory cell is the state 907, the memory cell may currently be configured to store bits "001", and the storage state of the memory cell may be represented by state information "F". Moreover, if the storage state of a certain memory cell is the state 908, the memory cell may currently be configured to store bits "000", and the storage state of the memory cell may be represented by state information "G". Moreover, if the rewritable non-volatile memory module 406 is an MLC NAND flash memory or other types of flash memory, the possible storage state of each of the memory cells in the first physical unit may be changed accordingly, but the invention is not limited thereto. In addition, the bit value corresponding to each of the storage states may also be adjusted according to practical requirements, but the invention is not limited thereto.

In an exemplary embodiment, the memory management circuit 61 may obtain the respective state information of the first memory cell and the second memory cell in the first physical unit. Taking FIG. 9 as an example, the state information of the first memory cell may reflect that the storage state of the first memory cell is one of the storage states A to G, and the state information of the second memory cell may reflect that the storage state of the second memory cell is one of the storage states A to G. For example, the memory management circuit 61 may send a read command sequence to the rewritable non-volatile memory module 43 to instruct the rewritable non-volatile memory module 43 to read data from the first physical unit. According to the data returned by the rewritable non-volatile memory module 43 (e.g., the storage bits shown in FIG. 9), the memory management circuit 61 may obtain the respective state information of the first memory cell and the second memory cell. For example, assuming that the storage bits read from the first memory cell and the second memory cells are "110" and "011" respectively, the memory management circuit 61 may obtain state information reflecting that the storage states of the first memory cell and the second memory cells are "A" and "D", respectively.

In an exemplary embodiment, the memory management circuit 61 may determine the grouping information corresponding to the at least two neighboring memory cells according to the state information of the first memory cell and the state information of the second memory cell. The memory management circuit 61 may determine the electrical parameter offset value corresponding to the at least two neighboring memory cells according to the grouping information.

FIG. 10A and FIG. 10B are schematic diagrams of grouping information of neighboring memory cells corresponding to different state combinations shown according to an exemplary embodiment of the invention. FIG. 10C is a schematic diagram of read level offset values corresponding to different grouping information shown according to an exemplary embodiment of the invention.

Referring to FIG. 10A and FIG. 10B, table information 1001 records the grouping information corresponding to state combinations of neighboring memory cells located on different bit lines BL(n) and BL(n+1), and table information 1002 records the grouping information corresponding to state combinations of neighboring memory cells located on different bit lines BL(n) and BL(n−1). For example, it is assumed that the state information of the memory cell (that is, the first memory cell) located on the bit line BL(n) in the first physical unit, the memory cell (that is, one of the second memory cells) located on the bit line BL(n+1), and the memory cell (that is, another of the second memory cells) located on BL(n−1) is respectively "A", "Er", and "D". According to the table information 1001, the memory management circuit 61 may obtain the grouping information corresponding to the memory cell located on the bit line BL(n) and the memory cell located on the bit line BL(n+1) as "G0". Similarly, according to the table information 1002, the memory management circuit 61 may obtain the grouping information corresponding to the memory cell located on the bit line BL(n) and the memory cell located on the bit line BL(n−1) as "G1".

Referring to FIG. 10C, table information 1003 records read level offset values corresponding to different grouping information. Continuing from the above example, according to the grouping information is the combination of "G0 (i.e., BL(n+1)=G0)" and "G1 (i.e., BL(n−1)=G1)", the memory management circuit 61 may obtain the offset values configured to adjust the read voltage level configured to read the first memory cell as, respectively "−2", "−1", "−1", "0", "2", "3", and "1" with reference to the table information 1003. In particular, L0 to L6 respectively correspond to the 7 read voltage levels of the TLC NAND flash memory. Taking the read voltage level L0 as an example, the offset value of the read voltage level corresponding to the read voltage level L0 is "−2", indicating that the read voltage level L0 corresponding to the first memory cell is reduced by 2 basic adjustment units of voltage during the period of reading the first memory cell. For example, the read voltage level L0 corresponding to the first memory cell is decreased from the current read voltage level by a basic adjustment unit of 2 voltages.

Or, taking the read voltage level L5 as an example, the offset value of the read voltage level corresponding to the read voltage level L5 is "3", indicating that the read voltage level L5 corresponding to the first memory cell is increased by 3 basic adjustment units of voltage during the period of reading the first memory cell. For example, the read voltage level L5 corresponding to the first memory cell is increased from the current read voltage level by a basic adjustment unit of 3 voltages. By correcting the read voltage level corresponding to the first memory cell by using the read level offset value corresponding to the specific group information, the accuracy of the data read from the first memory cell may be effectively improved. In another exemplary embodiment, the table information 1003 may also be configured to record the pass gate voltage offset values corresponding to different grouping information, but the invention is not limited thereto.

In an exemplary embodiment, if the group information corresponding to the memory cell located on the bit line BL(n) and the memory cell located on the bit line BL(n+1) is "G1", and the group information corresponding to the memory cell located on the bit line BL(n) and the memory cell located on the bit line BL(n−1) is also "G1", during the period of reading data from the first memory cell, the memory management circuit 61 may moderately increase the pass gate voltage of the second memory cell, so as to improve the accuracy of the data read from the first memory cell. Moreover, if the group information corresponding to the memory cell located on the bit line BL(n) and the memory cell located on the bit line BL(n+1) is "G0", and the group information corresponding to the memory cell located on the bit line BL(n) and the memory cell located on the bit line BL(n−1) is also "G0", during the period of reading data from the first memory cell, the memory management circuit 61 may moderately decrease the pass gate voltage of the second memory cell, so as to improve the accuracy of the data read from the first memory cell. The specific pass gate voltage adjustment may be set according to practical requirements, but the invention is not limited thereto.

In an exemplary embodiment, the at least two neighboring memory cells may further include memory cells (also referred to as third memory cells) located on neighboring word lines. Taking FIG. 8 as an example, assuming the first memory cell is the memory cell 822(2) on the word line 852, the third memory cells may include the memory cell 821(2) on the word line 851 and/or the memory cell 823(2) on the word line 853. The memory management circuit 61 may determine the electrical parameter offset value corresponding to the at least two neighboring memory cells according to the state information of the second memory cell and/or the third memory cells. In particular, the state information of the third memory cells may reflect the voltage range corresponding to the voltage (i.e., the threshold voltage) of the third memory cells. For example, according to the third memory cells in different states, the memory management circuit 61 may dynamically adjust the read voltage level configured to read the first memory cells and/or the pass gate voltage of the third memory cells during the period of reading the first memory cells. The relevant operation details are described in detail above, and are not repeated herein.

In an exemplary embodiment, the memory management circuit 61 may enable a dynamic adjustment mechanism of electrical parameters. In the dynamic adjustment mechanism of electrical parameters, the memory management circuit 61 may execute the operation of determining the electrical parameter offset value corresponding to the neighboring memory cells according to the state information of the neighboring memory cells and sending the read command sequence according to the electrical parameter offset value. The relevant operation details are described in detail above, and are not repeated herein. Alternatively, in an exemplary embodiment, the memory management circuit 61 may also disable (i.e., not turn on) the dynamic adjustment mechanism of electrical parameters.

In an exemplary embodiment, the memory management circuit 61 may determine whether to enable the adjustment mechanism of the electrical parameters according to the current risk state of the rewritable non-volatile memory module 43. For example, the memory management circuit 61 may obtain the current risk state of the rewritable non-volatile memory module 43 according to at least one evaluation parameter. For example, the evaluation parameter may include various parameters related to the degree of use of at least a portion of the physical units in the rewritable non-volatile memory module 43, such as programming count, erasing count, and/or bit error rate. The values of such evaluation parameters may be positively related to the degree of use of the at least a portion of the physical units. That is, the larger the value of these evaluation parameters, the higher the degree of use of at least a portion of the physical units in the rewritable non-volatile memory module 43. In addition, the data read in the rewritable non-volatile memory module 43 has a higher probability of containing erroneous bits.

In an exemplary embodiment, the memory management circuit 61 may determine whether the current risk state of the rewritable non-volatile memory module 43 exceeds an allowable range. For example, the memory management circuit 61 may determine whether the value of one or a plurality of evaluation parameters such as programming count, erasing count, and/or bit error rate exceeds the corresponding allowable value. If so, the memory management circuit 61 may determine that the current risk state of the rewritable non-volatile memory module 43 exceeds the allowable range. If not, the memory management circuit 61 may determine that the current risk state of the rewritable non-volatile memory module 43 does not exceed the allowable range. In response to the current risk state of the rewritable non-volatile memory module 43 exceeding the allowable range, the memory management circuit 61 may enable the adjustment mechanism of the electrical parameter to improve the stability of reading data from the memory cells. However, if the current risk state of the rewritable non-volatile memory module 43 does not exceed the allowable range, the memory management circuit 61 may not enable the adjustment mechanism of the electrical parameter, so as to reduce system load.

Figure 11:
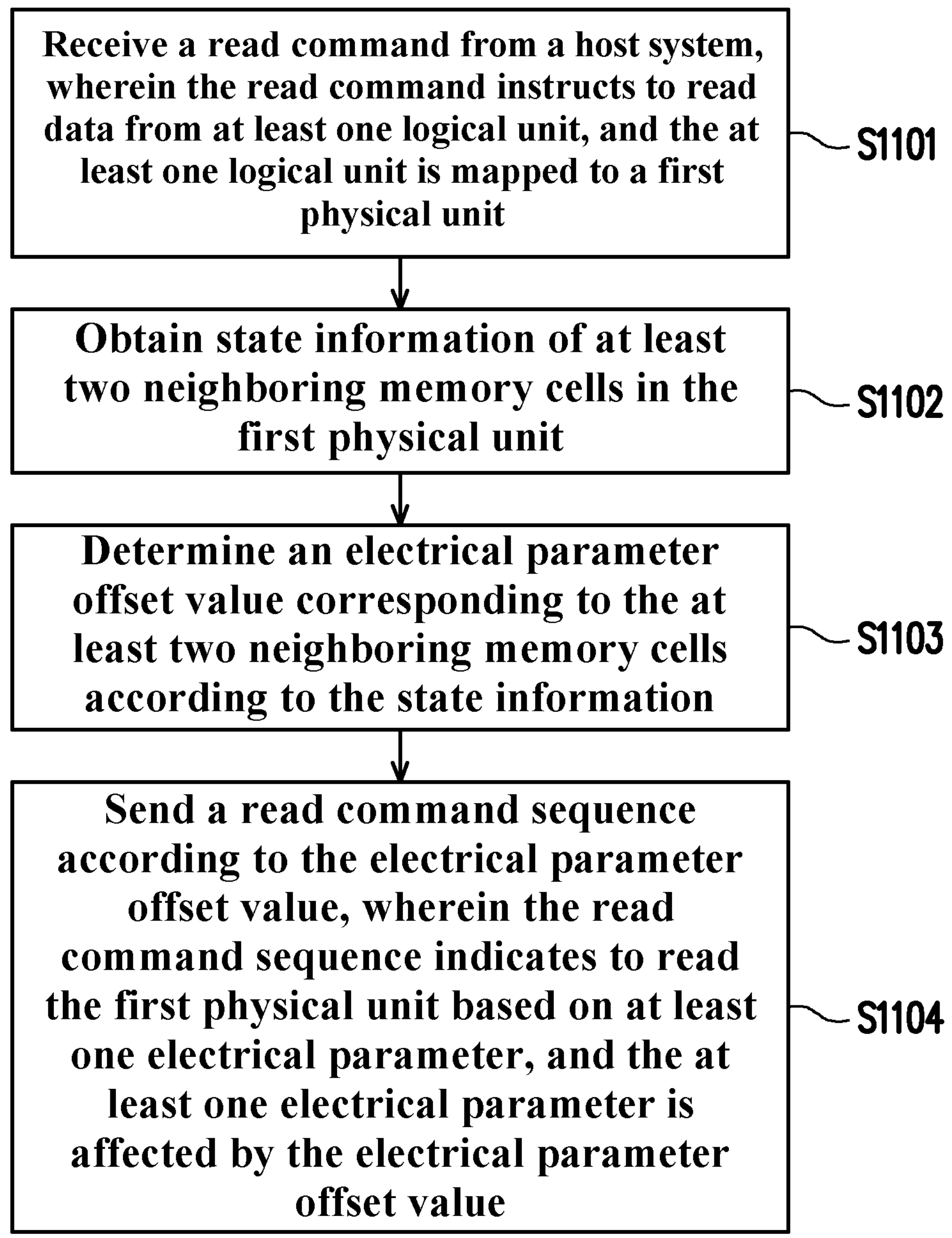
FIG. 11 is a flowchart of a data reading method shown according to an exemplary embodiment of the invention.

FIG. 11 is a flowchart of a data reading method shown according to an exemplary embodiment of the invention.

Referring to FIG. 11, in step S1101, a read command is received from a host system, wherein the read command instructs to read data from at least one logical unit, and the at least one logical unit is mapped to a first physical unit in the plurality of physical units. In step S1102, the state information of at least two neighboring memory cells in the first physical unit is obtained. In step S1103, an electrical parameter offset value corresponding to the at least two neighboring memory cells is determined according to the state information. In step S1104, a read command sequence is sent according to the electrical parameter offset value, wherein the read command sequence instructs to read the first physical unit based on at least one electrical parameter, and the at least one electrical parameter is controlled by the electrical parameter offset value.

However, each step in FIG. 11 is as described in detail above, and is not repeated herein. It should be mentioned that, each step in FIG. 11 may be implemented as a plurality of program codes or circuits, and the present application is not limited thereto. Moreover, the method of FIG. 11 may be used with the above exemplary embodiments, and may also be used alone, and the present application is not limited thereto.

Based on the above, an exemplary embodiment of the invention may dynamically adjust the electrical parameter offset value corresponding to the at least two neighboring memory cells in the physical unit to be read according to the state information of the at least two neighboring memory cells. Thereafter, the rewritable non-volatile memory module may adjust the at least one electrical parameter configured to read the first physical unit based on the electrical parameter offset value. Thereby, the electrical interference between the memory cells may be reduced and the stability of reading data from the memory cells may be improved.

Although the disclosure has been disclosed by the above embodiments, they are not intended to limit the disclosure. It is apparent to one of ordinary skill in the art that modifications and variations to the disclosure may be made without departing from the spirit and scope of the disclosure. Accordingly, the protection scope of the disclosure will be defined by the appended claims.

What is claimed is:

1. A data reading method, configured for a rewritable non-volatile memory module, wherein the rewritable non-volatile memory module comprises a plurality of physical units, and the data reading method comprises:

receiving a read command from a host system, wherein the read command instructs to read data from at least one logical unit, and the at least one logical unit is mapped to a first physical unit in the plurality of physical units;

obtaining state information of at least two neighboring memory cells in the first physical unit;

determining an electrical parameter offset value corresponding to the at least two neighboring memory cells according to the state information; and sending a read command sequence according to the electrical parameter offset value, wherein the read command sequence instructs to read the first physical unit based on at least one electrical parameter, and the at least one electrical parameter is controlled by the electrical parameter offset value.

2. The data reading method of claim 1, wherein the at least two neighboring memory cells comprise a first memory cell and a second memory cell, and the first memory cell and the second memory cell are respectively located on different bit lines neighboring each other in the rewritable non-volatile memory module.

3. The data reading method of claim 2, wherein the electrical parameter offset value comprises a read level offset value, and the read level offset value is configured to control a read voltage level applied to the first memory cell during a period of reading data from the first memory cell.

4. The data reading method of claim 2, wherein the electrical parameter offset value comprises a pass gate voltage offset value, and the pass gate voltage offset value is configured to control a pass gate voltage applied to the second memory cell during a period of reading data from the first memory cell.

5. The data reading method of claim 1, wherein the state information of the at least two neighboring memory cells reflects voltage ranges corresponding to respective threshold voltages of the at least two neighboring memory cells.

6. The data reading method of claim 1, wherein the at least two neighboring memory cells comprise a first memory cell and a second memory cell, and the step of determining the electrical parameter offset value corresponding to the at least two neighboring memory cells according to the state information comprises:

determining grouping information according to state information of the first memory cell and state information of the second memory cell; and determining the electrical parameter offset value corresponding to the at least two neighboring memory cells according to the grouping information.

7. The data reading method of claim 1, wherein the step of obtaining the state information of the at least two neighboring memory cells in the first physical unit comprises:

sending a read command sequence to instruct to read data from the first physical unit; and obtaining the state information of the at least two neighboring memory cells according to the data read.

8. The data reading method of claim 1, further comprising:

determining whether a risk state of the rewritable non-volatile memory module exceeds an allowable range; and enabling an adjustment mechanism of electrical parameter to obtain the state information of the at least two neighboring memory cells in response to the risk state exceeding the allowable range.

9. A memory storage device, comprising:

a connection interface unit configured to be coupled to a host system;

a rewritable non-volatile memory module comprising a plurality of physical units; and a memory control circuit unit coupled to the connection interface unit and the rewritable non-volatile memory module, wherein the memory control circuit unit is configured to:

receive a read command from the host system, wherein the read command instructs to read data from at least one logical unit, and the at least one logical unit is mapped to a first physical unit in the plurality of physical units;

obtaining state information of at least two neighboring memory cells in the first physical unit;

determining an electrical parameter offset value corresponding to the at least two neighboring memory cells according to the state information; and sending a read command sequence according to the electrical parameter offset value, wherein the read command sequence instructs to read the first physical unit based on at least one electrical parameter, and the at least one electrical parameter is controlled by the electrical parameter offset value.

10. The memory storage device of claim 9, wherein the at least two neighboring memory cells comprise a first memory cell and a second memory cell, and the first memory cell and the second memory cell are respectively located on different bit lines neighboring each other in the rewritable non-volatile memory module.

11. The memory storage device of claim 10, wherein the electrical parameter offset value comprises a read level offset value, and the read level offset value is configured to control a read voltage level applied to the first memory cell during a period of reading data from the first memory cell.

12. The memory storage device of claim 10, wherein the electrical parameter offset value comprises a pass gate voltage offset value, and the pass gate voltage offset value is configured to control a pass gate voltage applied to the second memory cell during a period of reading data from the first memory cell.

13. The memory storage device of claim 9, wherein the state information of the at least two neighboring memory cells reflects voltage ranges corresponding to respective threshold voltages of the at least two neighboring memory cells.

14. The memory storage device of claim 9, wherein the at least two neighboring memory cells comprise a first memory cell and a second memory cell, and the operation of the memory control circuit unit determining the electrical parameter offset value corresponding to the at least two neighboring memory cells according to the state information comprises:

determining grouping information according to state information of the first memory cell and state information of the second memory cell; and determining the electrical parameter offset value corresponding to the at least two neighboring memory cells according to the grouping information.

15. The memory storage device of claim 9, wherein the operation of the memory control circuit unit obtaining the state information of the at least two neighboring memory cells in the first physical unit comprises:

sending a read command sequence to instruct to read data from the first physical unit; and obtaining the state information of the at least two neighboring memory cells according to the data read.

16. The memory storage device of claim 9, wherein the memory control circuit unit is further configured to:

determine whether a risk state of the rewritable non-volatile memory module exceeds an allowable range; and enable an adjustment mechanism of electrical parameter to obtain the state information of the at least two neighboring memory cells in response to the risk state exceeding the allowable range.

17. A memory control circuit unit, comprising:

a host interface configured to be coupled to a host system;

a memory interface configured to be coupled to a rewritable non-volatile memory module, wherein the rewritable non-volatile memory module comprises a plurality of physical units; and a memory management circuit coupled to the host interface and the memory interface, wherein the memory management circuit is configured to:

receive a read command from the host system, wherein the read command instructs to read data from at least one logical unit, and the at least one logical unit is mapped to a first physical unit in the plurality of physical units;

obtain state information of at least two neighboring memory cells in the first physical unit;

determine an electrical parameter offset value corresponding to the at least two neighboring memory cells according to the state information; and send a read command sequence according to the electrical parameter offset value, wherein the read command sequence instructs to read the first physical unit based on at least one electrical parameter, and the at least one electrical parameter is controlled by the electrical parameter offset value.

18. The memory control circuit unit of claim 17, wherein the at least two neighboring memory cells comprise a first memory cell and a second memory cell, and the first memory cell and the second memory cell are respectively located on different bit lines neighboring each other in the rewritable non-volatile memory module.

19. The memory control circuit unit of claim 18, wherein the electrical parameter offset value comprises a read level offset value, and the read level offset value is configured to control a read voltage level applied to the first memory cell during a period of reading data from the first memory cell.

20. The memory control circuit unit of claim 18, wherein the electrical parameter offset value comprises a pass gate voltage offset value, and the pass gate voltage offset value is configured to control a pass gate voltage applied to the second memory cell during a period of reading data from the first memory cell.

21. The memory control circuit unit of claim 17, wherein the state information of the at least two neighboring memory cells reflects voltage ranges corresponding to respective threshold voltages of the at least two neighboring memory cells.

22. The memory control circuit unit of claim 17, wherein the at least two neighboring memory cells comprise a first memory cell and a second memory cell, and the operation of the memory management circuit determining the electrical parameter offset value corresponding to the at least two neighboring memory cells according to the state information comprises:

determining grouping information according to state information of the first memory cell and state information of the second memory cell; and determining the electrical parameter offset value corresponding to the at least two neighboring memory cells according to the grouping information.

23. The memory control circuit unit of claim 17, wherein the operation of the memory management circuit obtaining the state information of the at least two neighboring memory cells in the first physical unit comprises:

sending a read command sequence to instruct to read data from the first physical unit; and obtaining the state information of the at least two neighboring memory cells according to the data read.

24. The memory control circuit unit of claim 17, wherein the memory management circuit is further configured to:

determine whether a risk state of the rewritable non-volatile memory module exceeds an allowable range; and enable an adjustment mechanism of electrical parameter to obtain the state information of the at least two neighboring memory cells in response to the risk state exceeding the allowable range.

* * * * *